United States Patent [19]
Isshiki et al.

[11] Patent Number: 5,585,670
[45] Date of Patent: Dec. 17, 1996

[54] SEMICONDUCTOR DEVICE PACKAGE

[75] Inventors: Masaharu Isshiki; Toshihiko Sugahara, both of Hyogo, Japan

[73] Assignees: Mitsubishi Electric Semiconductor Software Co., Hyogo; Mitsubishi Denki Kabushiki Kaisha, Tokyo, both of Japan

[21] Appl. No.: 527,466

[22] Filed: Sep. 13, 1995

[30] Foreign Application Priority Data

Sep. 5, 1995 [JP] Japan .................................. 7-110666

[51] Int. Cl.⁶ ................ H01L 23/52; H01L 23/495
[52] U.S. Cl. .................... 257/691; 257/676; 257/696; 361/813; 361/820
[58] Field of Search .................... 257/659, 660, 257/666, 696, 670, 676, 691; 361/813, 820

[56] References Cited

U.S. PATENT DOCUMENTS

| | | | |
|---|---|---|---|
| 4,331,831 | 5/1982 | Ingram et al. | 257/676 |
| 5,041,901 | 8/1991 | Kitano et al. | 257/696 |
| 5,117,068 | 5/1992 | Seieroe et al. | 174/52.4 |
| 5,153,379 | 10/1992 | Guzuk et al. | 174/35 R |
| 5,196,725 | 3/1993 | Mita et al. | 257/672 |
| 5,235,207 | 8/1993 | Ohi et al. | 257/670 |
| 5,309,018 | 5/1994 | Shibata | 257/666 |
| 5,367,124 | 11/1994 | Hoffman et al. | 257/696 |
| 5,466,967 | 11/1995 | Westerkamp | 257/666 |

FOREIGN PATENT DOCUMENTS 5-251616  9/1993  Japan .

*Primary Examiner*—Sara W. Crane
*Assistant Examiner*—David Ostrowski
*Attorney, Agent, or Firm*—Lowe, Price, LeBlanc & Becker

[57] ABSTRACT

Disclosed herein is a semiconductor device package including a ground frame formed of a metal plate. The ground frame has a rectangular central portion, four legs integrally extending outward from the four corners of the central portion, and four grounding lead terminals formed integrally with the outer ends of the four legs. The width of each grounding lead terminal including a grounding portion is set to about three to five times the width of each lead terminal. The outer end of each grounding lead terminal is slightly projected outward from the outer end of each lead terminal. Accordingly, a stable ground potential can be ensured, and deformation of each lead terminal can be reliably prevented.

5 Claims, 5 Drawing Sheets

SEMICONDUCTOR DEVICE PACKAGE

BACKGROUND OF THE INVENTION

1. Field of the Invention

The present invention relates to a semiconductor device package and, more particularly, to a semiconductor device package which can ensure a stable ground potential and reliably prevent deformation of lead terminals.

2. Description of the Prior Art

FIG. 1 is a perspective view showing the appearance of a semiconductor device package in the prior art, and FIG. 2 is a sectional view of the semiconductor device package shown in FIG. 1. As shown in FIGS. 1 and 2, the semiconductor device package includes a semiconductor device 1 provided with an integrated circuit, a conductor plate (ground frame) 2 formed of alumina or the like and constituting a die bond area where the semiconductor device 1 is bonded, a plurality of lead terminals 3 each having one end connected to the semiconductor device 1 and the other end connected to an external device (not shown), a plurality of thin metal wires 4 for electrically connecting the semiconductor device 1 to the lead terminals 3 by wire bonding, and a sealing member 5 formed of resin for sealing the semiconductor device 1 mounted on the die bond area 2, the thin metal wires 4, and a part of each of the lead terminals 3. As shown in FIG. 1, the lead terminals 3 are arranged at equal intervals on each side of the semiconductor device package, and have the same shape and the same sectional area.

The operation of the semiconductor device package shown in FIGS. 1 and 2 will now be described. In the semiconductor device 1 sealed by molded resin, signals are transferred between it and the external devices via the lead terminals 3. Further, a supply potential $V_{CC}$ is applied from a power supply, not shown, to the semiconductor device 1, thereby performing a desired operation. Predetermined ones of the lead terminals 3 are connected to a ground potential $V_{EE}$ of the power supply or the like. In an electronic circuit including the semiconductor device 1 handling high-speed signals or very weak signals, the supply potential $V_{CC}$ and the ground potential $V_{EE}$ must be stably supplied.

In this semiconductor device package, the lead terminals 3 must be thinned to meet such a requirement of reducing the size of the package. As a result, because the strength of the lead terminals 3 is decreased, there exists a problem such that the lead terminals 3 in the vicinity of the corners of the package are deformed in handling the package before mounted on a substrate, e.g., in carrying the package for the purpose of measurement for testing. To solve this problem, there has been disclosed a semiconductor device package having four reinforcement lead terminals located at the four corners of the package, wherein the reinforcement lead terminals are thicker than the usual lead terminals 3.

FIG. 3 is a plan view of such a prior art semiconductor device package disclosed in Japanese Patent Laid-open No. Hei 5-251616 (JP-A 5-251616). As shown in FIG. 3, the semiconductor device package includes a sealing member 5, a plurality of lead terminals 3 exposed to the outside of the package, and four reinforcement lead terminals 6 located at the four corners of the package.

The operation of the semiconductor device package shown in FIG. 3 will now be described. In handling the semiconductor device package before mounted on a circuit board, the reinforcement lead terminals 6 function to protect the exposed lead terminals 3 from collision against a side surface of a shooter or the like in carrying the package on the shooter, thus preventing deformation of the lead terminals 3. Furthermore, also after mounting the semiconductor device package on the circuit board, the four corners of the package are stably supported by the reinforcement lead terminals 6. Furthermore, by soldering the outer ends of the reinforcement lead terminals 6 to the substrate, the connection strength between the semiconductor device package and the circuit board can be increased.

In each prior art semiconductor device package, however, the impedance of each lead terminal 3 is large, so that a stable ground potential cannot be ensured especially in handling high-speed digital signals.

Moreover, in the prior art semiconductor device package having the reinforcement lead terminals 6, the length of each reinforcement lead terminal 6 is decided so that the outer ends of the reinforcement lead terminals 6 are aligned with the outer ends of the lead terminals 3. Therefore, the deformation of the lead terminals 3 cannot be effectively prevented.

SUMMARY OF THE INVENTION

It is accordingly an object of the present invention to provide a semiconductor device package which can ensure a stable ground potential.

It is another object of the present invention to provide a semiconductor device package which can reliably prevent deformation of each lead terminal.

According to the present invention, there is provided in a semiconductor device package having a semiconductor device, a ground frame having a rectangular central portion forming a die bond area where the semiconductor device is mounted, four legs formed integrally with the central portion and extending outward from four corners of the central portion so as to form an X-shaped configuration, and four end portions formed integrally with outer ends of the legs to function as grounding lead terminals, wherein each of the four end portions of the ground frame has a width larger than width of each of the lead terminals.

Since the width of each end portion of the ground frame as the grounding lead terminal is larger than the width of each lead terminal, the impedance of the ground frame can be reduced. Accordingly, variations in ground potential can be suppressed to thereby allow the supply of a stable ground potential. Furthermore, in contrast with the prior art where the terminals for supplying a ground potential are allocated to arbitrary ones of the lead terminals, the ground frame in the present invention is used to supply a ground potential, so that all the lead terminals can be more effectively used.

Preferably, the width of each of the four end portions of the ground frame is set as large as possible. Accordingly, the impedance of the ground frame can be made as small as possible, thereby allowing the supply of a stable ground potential.

Preferably, each of the four end portions of the ground frame is projected outward from the outer end of each of the plural lead terminals exposed to the outside of the sealing member. Accordingly, it is possible to prevent that the plural lead terminals provided at the side portions of the semiconductor device package may directly receive a shock in carrying the semiconductor device package on a tray or the like.

More preferably, each of the four end portions of the ground frame is provided with a bent portion, and a projection is formed at the bent portion. Accordingly, the strength of each end portion functioning as the grounding lead terminal in its longitudinal direction can be increased to thereby reliably prevent damage to each end portion of the ground frame such that it may be curled by the shock as in carrying the semiconductor device package.

Furthermore, each of the four end portions of the ground frame may be provided with a linear projection extending in a longitudinal direction of each end portion. Accordingly, the strength of each end portion in its longitudinal and transverse directions can be more increased to thereby reliably prevent damage to each end portion of the ground frame such that it may be curled or twisted by the shock as in carrying the semiconductor device package.

Other objects and features of the invention will be more fully understood from the following detailed description and appended claims when taken with the accompanying drawings.

DETAILED DESCRIPTION OF THE PREFERRED EMBODIMENTS

Figure 1:
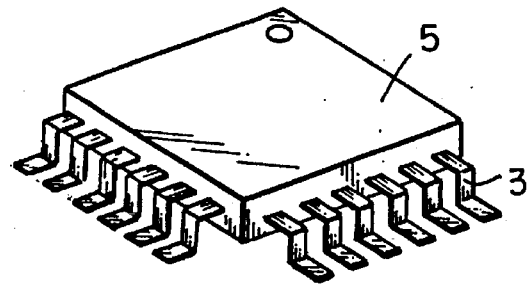
FIG. 1 is a perspective view showing the appearance of a semiconductor device package in the prior art.
Figure 2:
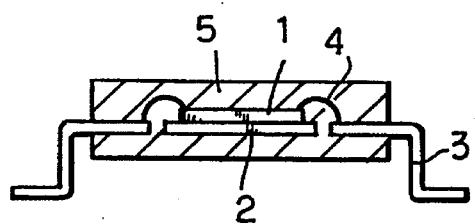
FIG. 2 is a sectional view showing the internal structure of the semiconductor device package shown in FIG. 1.
Figure 3:
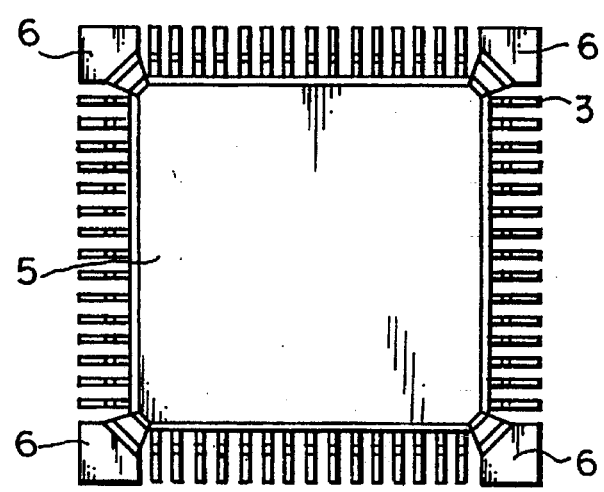
FIG. 3 is a plan view showing the appearance of another semiconductor device package in the prior art.
Figure 4:
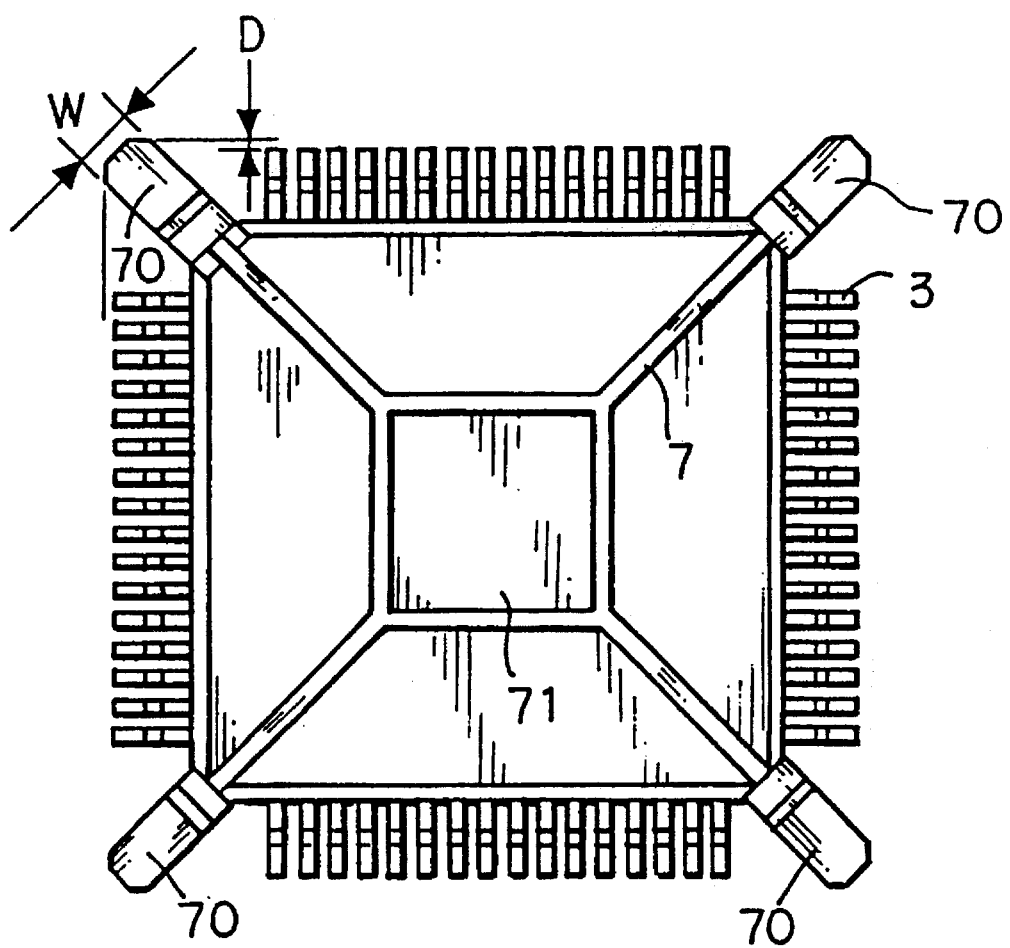
FIG. 4 is a plan view showing the internal structure of a semiconductor device package according to a first preferred embodiment of the present invention.
Figure 5A:
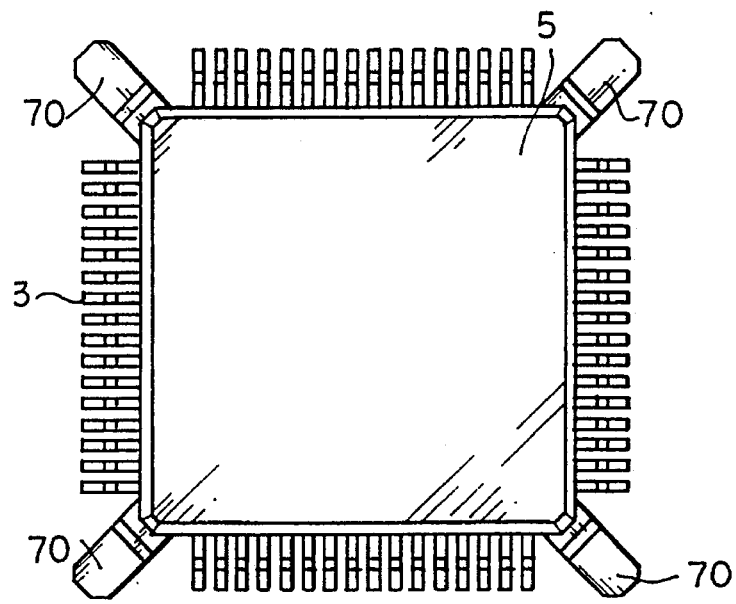
FIGS. 5(a) and 5(b) are a plan view and a side view, respectively, showing the appearance of the semiconductor device package shown in FIG. 4.
Figure 5B:
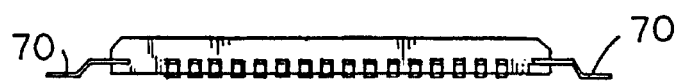
Figure 6:
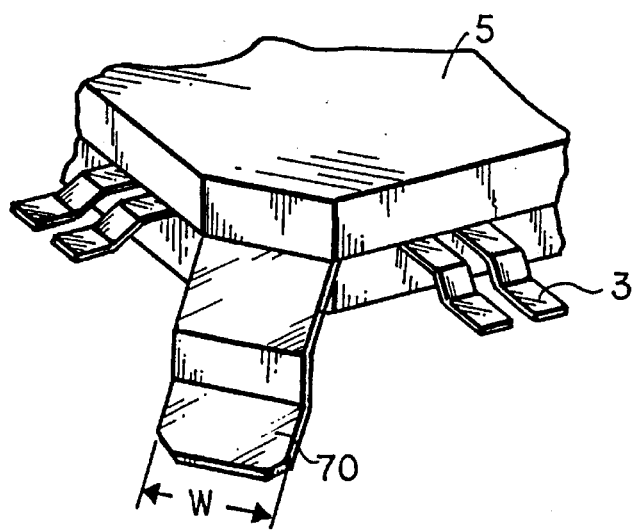
FIG. 6 is a perspective view showing one of grounding lead terminals and its peripheral portion in the semiconductor device package shown in FIG. 4.

FIG. 4 is a plan view showing the internal structure of a semiconductor device package according to a first preferred embodiment of the present invention; FIGS. 5(a) and 5(b) are a plan view and a side view, respectively, showing the appearance of the semiconductor device package; and FIG. 6 is a perspective view showing one of grounding lead terminals and its peripheral portion in the semiconductor device package. As shown in FIGS. 4 to 6, the semiconductor device package includes a plurality of lead terminals 3, a ground frame 7 having a central portion 71 and four grounding lead terminals 70 as end portions, and a sealing member 5 formed of resin for sealing a semiconductor device (not shown), bonding wires (not shown), a part of each of the lead terminals 3, and the ground frame 7 except the four grounding lead terminals 70. The central portion 71, the four legs, and the four grounding lead terminals 70 are integrally formed together. The central portion 71 forms the center of the ground frame 7, and the semiconductor device is mounted on the central portion 71. The four grounding lead terminals 70 are connected through the four legs to the central portion 71, and functions as bonding portions.

The ground frame 7 is formed of a metal plate such as an aluminum alloy plate. The four legs extend outward from the four corners of the central portion 71 having a rectangular shape (square or oblong shape) so as to form an X-shaped configuration. The four grounding lead terminals 70 are formed at the outer ends of the four legs. More specifically, the four legs are thin portions having the same length, and lie on the extensions of the lines connecting the center of the central portion 71 and the four corners thereof. Each grounding lead terminal 70 has a width larger than width of each leg. Further, as apparent from FIG. 6, the width W of each grounding lead terminal 70 including a grounding portion is set to about three to five times the width of each lead terminal 3. The outer end of each grounding lead terminal 70 is slightly projected outward from the outer end of each lead terminal 3 (by a distance D as viewed in FIG. 4).

The ground frame 7 can be greatly easily formed by cutting a metal plate into the X-shape as shown in FIG. 4 and then pressing the four outer end portions of the X-shaped member obtained above so as to form the grounding portions of the grounding lead terminals 70.

The operation of this preferred embodiment will now be described. During the operation of the semiconductor device, a stable ground potential is ensured through the ground frame 7. Since the width W of each grounding lead terminal 70 is set to about three to five times the width of each lead terminal 3 as mentioned above, the impedance of the ground frame 7 can be made much smaller than the frame in the prior art semiconductor device package. Therefore, variations in ground potential can be suppressed to thereby allow the supply of a stable ground potential. To more reduce the impedance of the ground frame 7, it is desirable to make the width of each leg 7a as large as possible and make the length of each grounding lead terminal 70 as small as possible.

In the prior art, a ground potential is supplied through arbitrary ones of the lead terminals 3. To the contrary, in this preferred embodiment, a ground potential is supplied through the ground frame 7, so that all the lead terminals 3 can be more effectively used.

In this preferred embodiment, the outer end of each grounding lead terminal 70 in the semiconductor device package is slightly projected outward from the outer end of each lead terminal 3. Accordingly, in carrying a plurality of semiconductor device packages on the same tray, it is possible to prevent that the plural lead terminals 3 provided on the side portions of the semiconductor device package may receive a direct shock. Therefore, it is possible to prevent deformation of the lead terminals 3 in the vicinity of the four corners of the package due to a shock applied in an oblique direction of the package. Simultaneously, it is also possible to prevent deformation or curling of the lead terminals 3 in their longitudinal direction due to a shock applied in a direction perpendicular to any side of the package.

Figure 7A:
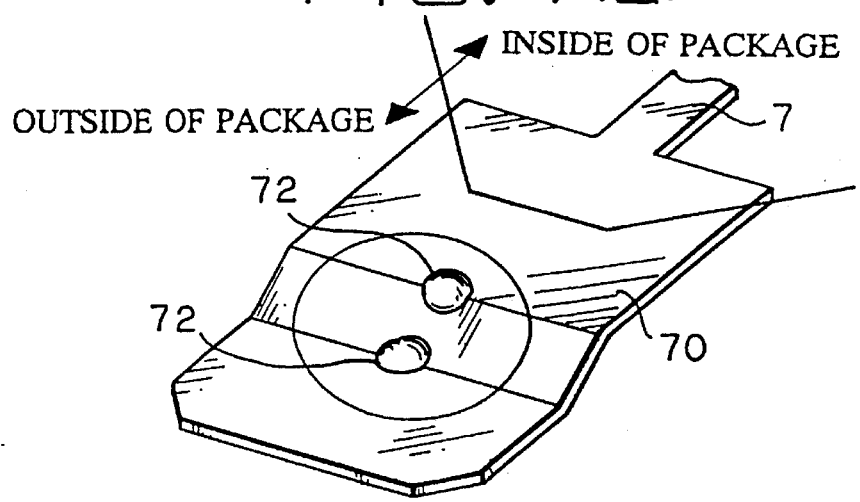
FIGS. 7(a) and 7(b) are a perspective view and a side view, respectively, showing one of grounding lead terminals in a semiconductor device package according to a second preferred embodiment of the present invention.
Figure 7B:
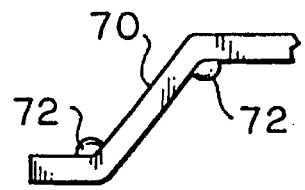
Figure 8:
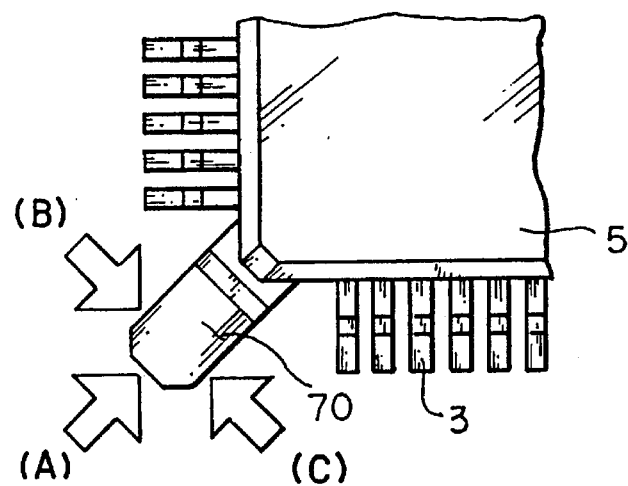
FIG. 8 is a plan view showing the directions of the shock applied to the grounding lead terminal in the semiconductor device package.

FIGS. 7(a) and 7(b) are a perspective view and a side view, respectively, showing one of grounding lead terminals 70 in a semiconductor device package in a second preferred embodiment according to the present invention, and FIG. 8 is a plan view showing the directions of the shock applied to the grounding lead terminal 70. In FIGS. 7(a) and 7(b), reference numerals 72 denote two projections for reinforcing two bent portions of each grounding lead terminal 70 forming each end portion of the ground frame 7. Other parts in the semiconductor device package in this preferred embodiment are similar to those in the first preferred embodiment shown in FIGS. 4 to 6, and the description thereof will therefore be omitted.

As shown in FIG. 7(b), the two projections 72 are formed by pressing or the like so as to project from the insides of the bent portions of each grounding lead terminal 70.

The operation of this preferred embodiment will now be described. As shown in FIG. 8, there is a possibility that each grounding lead terminal 70 for protecting the lead terminals 3 from a shock applied to the semiconductor device package in carrying the package may receive the shock in the direction of an arrow (A), (B), or (C). If the shock is applied in the direction of the arrow (A), there is the possibility that the grounding lead terminal 70 may be curled. If the shock is applied in the direction of the arrow (B) or (C), there is the possibility that the grounding lead terminal 70 may be twisted. The projections 72 formed at the bent portions of each grounding lead terminal 70 shown in FIG. 7(a) function to protect each grounding lead terminal 70 from the shock applied in the direction of the arrow (A).

In this manner, the strength of each grounding lead terminal 70 in its longitudinal direction can be increased by the projections 72 to thereby reliably prevent damage to each grounding lead terminal 70 such that it may be curled by the shock as in carrying the semiconductor device package.

Figure 9:
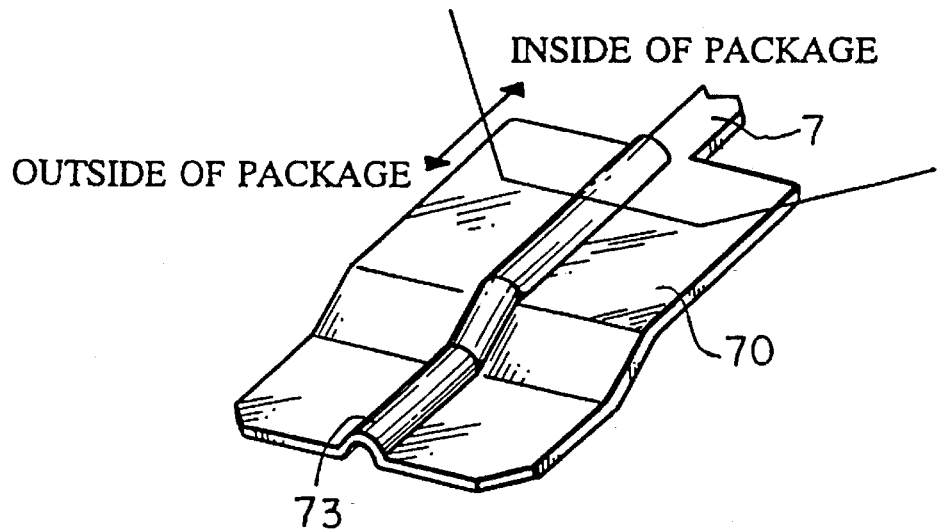
FIG. 9 is a perspective view showing one of grounding lead terminals in a semiconductor device package according to a third preferred embodiment of the present invention.

FIG. 9 is a perspective view showing one of grounding lead terminals 70 in a semiconductor device package in a third preferred embodiment according to the present invention. In FIG. 9, reference numeral 73 denotes a linear projection extending in the longitudinal direction of each grounding lead terminal 70 forming each end portion of the ground frame 7, so as to more increase the strength of each grounding lead terminal 70 in its longitudinal and transverse directions. Other parts of the semiconductor device package in this preferred embodiment are similar to those in the first preferred embodiment shown in FIGS. 4 to 6, and the description thereof will therefore be omitted.

The projection 73 is linearly formed on the upper surface of each grounding lead terminal 70 in its longitudinal direction by pressing or the like.

The operation of this preferred embodiment will now be described. The linear projection 73 extends over the length of each grounding lead terminal 70 in its longitudinal direction at a transversely central portion thereof, so as to more increase the strength of each grounding lead terminal 70 in its longitudinal and transverse directions. Thus, the linear projection 73 functions to protect each grounding lead terminal 70 from the shock applied in any direction of the arrow (A), (B), or (C) shown in FIG. 8.

In this manner, the strength of each grounding lead terminal 70 in its longitudinal and transverse directions can be more increased to thereby reliably prevent damage to each grounding lead terminal 70 such that it may be curled or twisted by the shock as in carrying the semiconductor device package.

Figure 10:
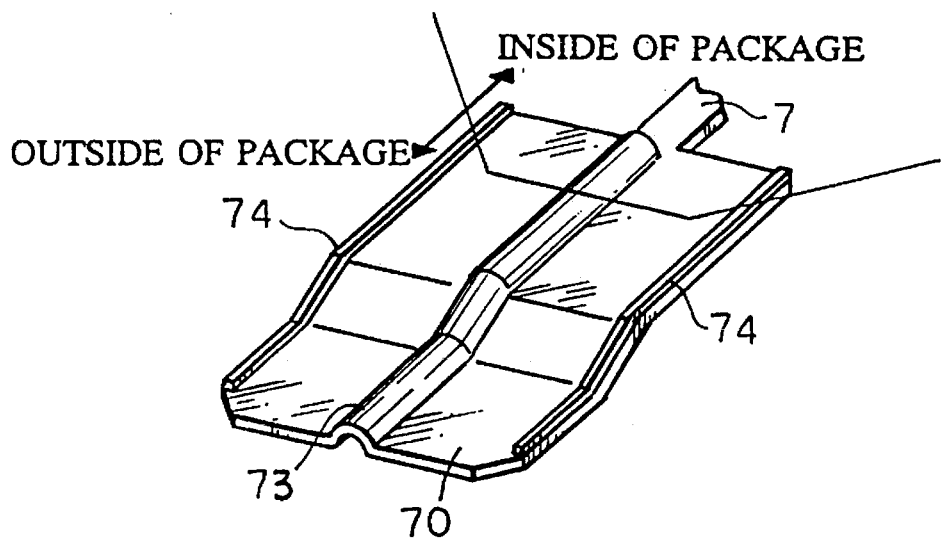
FIG. 10 is a perspective view showing one of grounding lead terminals in a semiconductor device package according to a fourth preferred embodiment of the present invention.

FIG. 10 is a perspective view showing one of grounding lead terminals 70 in a semiconductor device package in a fourth preferred embodiment according to the present invention. In FIG. 10, the same parts as those in FIG. 9 are denoted by the same reference numerals, and the description thereof will be omitted. Reference numerals 74 denote a pair of linear projections formed at both side portions of each grounding lead terminal 70 so as to extend in its longitudinal direction in order to much more increase the strength of each grounding lead terminal 70 in its longitudinal and transverse directions. Other parts of the semiconductor device package in this preferred embodiment are similar to those in the first preferred embodiment shown in FIGS. 4 to 6, and the description thereof will therefore be omitted.

The linear projections 74 are formed by pressing or the like to bend both side portions of each grounding lead terminal 70.

The operation of this preferred embodiment will now be described. The two linear projections 74 extend over the length of each grounding lead terminal 70 in its longitudinal direction at both side portions thereof, so as to much more increase the strength of each grounding lead terminal 70 in its longitudinal and transverse directions. Thus, the linear projections 74 function to protect each grounding lead terminal 70 from the shock applied in any direction of the arrow (A), (B), or (C) shown in FIG. 8.

In this manner, the strength of each grounding lead terminal 70 in its longitudinal and transverse directions can be much more increased to thereby reliably prevent damage to each grounding lead terminal 70 such that it may be curled or twisted by the shock as in carrying the semiconductor device package.

According to the present invention as described above, the following effects can be exhibited.

The semiconductor device package according to the present invention includes a ground frame having a rectangular central portion forming a die bond area where a semiconductor device is mounted, four legs formed integrally with the central portion and extending outward from the four corners of the central portion so as to form an X-shaped configuration, and four end portions formed integrally with the outer ends of the legs to function as grounding lead terminals, wherein each of the four end portions of the ground frame has a width larger than width of each of the plural lead terminals. Accordingly, variations in ground potential can be suppressed to thereby allow the supply of a stable ground potential. Further, in contrast with the prior art wherein the terminals for supplying a ground potential are allocated to arbitrary ones of the lead terminals, the ground frame in the present invention is used to supply a ground potential, so that all the lead terminals can be more effectively used.

The width of each of the four end portions of the ground frame is set as large as possible. Accordingly, a stable ground potential can be supplied.

Each of the four end portions of the ground frame is projected outward from the outer end of each of the plural lead terminals exposed to the outside of the sealing member. Accordingly, it is possible to prevent deformation of the lead terminals in the vicinity of the four corners of the semiconductor device package due to a shock applied in an oblique direction of the semiconductor device package. Further, it is possible to also prevent lengthwise deformation of the lead terminals due to a shock applied in a direction perpendicular to any side of the semiconductor device package.

Each of the four end portions of the ground frame is provided with a bent portion, and a projection is formed at the bent portion. Accordingly, it is possible to reliably prevent damage to each end portion as the grounding lead terminal such that it may be curled by the shock as in carrying the semiconductor device package.

Each of the four end portions of the ground frame is provided with a linear projection extending in a longitudinal direction of each end portion. Accordingly, it is possible to reliably prevent damage to each end portion as the grounding lead terminal such that it may be curled or twisted by the shock as in carrying the semiconductor device package.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A semiconductor device package for sealing a semiconductor device and a plurality of lead terminals for electrically connecting said semiconductor device to external devices, comprising:

a ground frame having a central portion forming a die bond area where said semiconductor device is mounted, four legs formed integrally with said central portion and extending outward from said central portion, and four end portions formed integrally with outer ends of said legs to function as grounding lead terminals, wherein each of said four end portions of said ground frame has a width larger than width of each of said lead terminals and extends beyond each of said lead terminals.

2. A semiconductor device package according to claim 1, wherein the width of each of said four end portions of said ground frame is from three to five times the width of the lead terminals for electrically connecting said semiconductor device to the external devices.

3. A semiconductor device package according to claim 1, wherein each of said four end portions of said ground frame comprises a first section extending outwardly from the package, a second section extending at an angle from the first section, and a third section extending at an angle from the second section and in substantially the same direction as the first section.

4. A semiconductor device package according to claim 1, wherein each of said four end portions of said ground frame comprises a reinforcement section extending outwardly from the package.

5. A semiconductor device package according to claim 3, wherein each of said four end portions of said ground frame comprises a reinforcement section extending outwardly from the package.

* * * * *